United States Patent
Ma et al.

(10) Patent No.: US 10,665,584 B1
(45) Date of Patent: May 26, 2020

(54) LOW CAPACITANCE AND HIGH-HOLDING-VOLTAGE TRANSIENT-VOLTAGE-SUPPRESSOR (TVS) DEVICE FOR ELECTRO-STATIC-DISCHARGE (ESD) PROTECTION

(71) Applicant: Hong Kong Applied Science and Technology Research Institute Company, Limited, Hong Kong (HK)

(72) Inventors: Chenyue Ma, Hong Kong (HK); Chun-Kit Yam, Hong Kong (HK); Xiao Huo, Hong Kong (HK)

(73) Assignee: Hong Kong Applied Science and Technology Research Insstitute Company, Limited, Hong Kong (HK)

( * ) Notice: Subject to any disclaimer, the term of this patent is extended or adjusted under 35 U.S.C. 154(b) by 0 days.

(21) Appl. No.: 16/295,159

(22) Filed: Mar. 7, 2019

(51) Int. Cl.
*H01L 27/02* (2006.01)
*H01L 29/08* (2006.01)
*H01L 29/74* (2006.01)

(52) U.S. Cl.
CPC ........ *H01L 27/0262* (2013.01); *H01L 29/083* (2013.01); *H01L 29/7412* (2013.01)

(58) Field of Classification Search
None
See application file for complete search history.

(56) References Cited

U.S. PATENT DOCUMENTS

| | | |
|---|---|---|
| 5,012,317 A | 4/1991 | Rountre |
| 5,343,053 A | 8/1994 | Avery |
| 6,610,262 B1 | 8/2003 | Peng et al. |
| 7,910,998 B2 | 3/2011 | Hwang |
| 8,088,991 B2 | 1/2012 | Beasley et al. |
| 8,597,993 B2 | 12/2013 | Chang et al. |

(Continued)

FOREIGN PATENT DOCUMENTS

| | | |
|---|---|---|
| CN | 102110686 A | 6/2011 |
| CN | 104538392 | 4/2015 |

(Continued)

OTHER PUBLICATIONS

ISR and Written Opinion, PCT/CN2019/077667, dated Nov. 26, 2019.

*Primary Examiner* — Khaja Ahmad
(74) *Attorney, Agent, or Firm* — Stuart T. Auvinen; gPatent LLC

(57) ABSTRACT

A well-less Transient Voltage Suppressor (TVS) Silicon-Controlled Rectifier (SCR) has a P+ anode region that is not in an N-well. The P+ anode region 20 is surrounded by N+ isolation regions near the surface, and a deep N+ region underneath that is formed in a p-substrate. A N+ cathode region is formed in the p-substrate. The deep N+ region has a doping of $5 \times 10^{18}$ to $5 \times 10^{19}/cm^3$, compared to a doping of $1 \times 10^{16}/cm^3$ for a typical N-well, or a doping of $1 \times 10^{13}$ to $1 \times 10^{15}/cm^3$ for the p-substrate. The high doping in the deep N+ region causes a recombination current that can shunt half of the anode current. Since the deep N+ region is much shallower than an N-well, the sidewall capacitance is greatly reduced, allowing for higher speed applications.

20 Claims, 14 Drawing Sheets

(56) References Cited

U.S. PATENT DOCUMENTS

| | | | |
|---|---|---|---|
| 8,648,419 B2 | 2/2014 | Gendron et al. | |
| 2008/0012044 A1* | 1/2008 | Salcedo | H01L 27/0262 257/173 |
| 2009/0237847 A1* | 9/2009 | Ryu | H01L 27/0262 361/56 |
| 2014/0111892 A1* | 4/2014 | Chen | H01L 27/0262 361/56 |
| 2017/0069616 A1* | 3/2017 | Cai | H01L 27/0255 |

FOREIGN PATENT DOCUMENTS

| | | |
|---|---|---|
| CN | 106158744 | 11/2016 |
| CN | 107731810 | 2/2018 |
| CN | 207719205 | 8/2018 |

\* cited by examiner

LOW CAPACITANCE AND HIGH-HOLDING-VOLTAGE TRANSIENT-VOLTAGE-SUPPRESSOR (TVS) DEVICE FOR ELECTRO-STATIC-DISCHARGE (ESD) PROTECTION

FIELD OF THE INVENTION

This invention relates to Electro-Static-Discharge (ESD) protection devices, and more particularly to a low-capacitance and high-holding voltage diode.

BACKGROUND OF THE INVENTION

Many different kinds of Integrated circuits (IC's) are prone to damage and failure from an electro-static-discharge (ESD) pulse. ESD failures that occur in the factory contribute to lower yields. ESD failures may also occur in the field when an end-user touches a device.

Various ESD-protection structures have been placed near input, output, or bi-directional I/O pins of ICs. Many of these protection structures use passive components such as series resistors, diodes, and thick-oxide transistors. Other ESD structures use an active transistor to safely shunt ESD current.

As manufacturing ability improves and device sizes shrink, lower voltages are applied to transistors during normal operation. These smaller transistors are much more susceptible to over-voltage failure but can operate with a lower power-supply voltage, thus consuming less power and producing less heat.

Such smaller transistors are often placed in an internal "core" of an IC, while larger transistors with gate lengths that are above the minimum are placed around the core in the periphery. ESD-protection structures are placed in the periphery using these larger transistors.

Thinner gate oxides of the core transistors can be shorted, and substrate junctions melted, by relatively small capacitively-coupled currents applied to the tiny core devices. Static charges from a person or machinery can produce such damaging currents that are only partially blocked by the input-protection circuits in the periphery.

FIG. 1 shows a chip with several ESD-protection clamps. Core circuitry 250 contains core transistors 322, 324, which have a small channel length and can be damaged by currents at relatively low voltages. Core circuitry 250 receives a power supply voltage VDD, such as 1.8 volts, 1.2 volts, or some other value. There may be thousands of core transistors in core circuitry 250.

Protection from ESD pulses may be provided on each I/O pad, and by power clamp 326. Power clamp 326 is coupled between VDD and ground (VSS), and shunts current from an ESD pulse between the power rails.

Some cross-coupling may occur between different pads and core circuitry 250, such as through substrates and capacitances. An ESD pulse applied to one I/O pad 10 may be coupled into core circuitry 250 by this cross-coupling, causing damage to transistors 322, 324 in core circuitry 250. Power clamp 326 may shunt enough current from the ESD pulse to reduce such cross-coupling to prevent damage. ESD pulses applied to I/O pins may still couple into core circuitry 250, such as through power lines, but power clamp 326 may then be activated to reduce potential damage.

Power clamp 326 may also turn on for other ESD pulses such as those applied to I/O pins, when the ESD pulse is shunted through a diode in the I/O pin's ESD-protection structure to the internal VDD rail, causing an indirect VDD-to-VSS ESD pulse. For example, an ESD pulse applied to I/O pad 10 may cause ESD protection device 12 to turn on to conduct to VDD.

Each I/O pad 10 and 11 may be outfitted with one or more ESD protection devices 12, 16 and 14, 18 to protect against various possibilities. ESD protection device 16 turns on and discharges a negative ESD pulse from I/O pad 10 to ground. ESD protection device 18 turns on and discharges a negative ESD pulse from I/O pad 11 to ground. Likewise, ESD protection device 12 turns on and discharges a positive ESD pulse from I/O pad 10 to ground via the power clamp 326. ESD protection device 14 turns on and discharges a positive ESD pulse from I/O pad 11 to ground via the power clamp 326.

Some prior-art ESD protection structures have large-area capacitors, resistors, or transistors. Large size devices are expensive and undesirable. Some prior-art ESD-protection devices are not suited for standard CMOS processes, such as ESD-protection devices that use insulator layers in Silicon-On-Insulator (SOI) processes.

Diodes have been uses as ESD-protection structures, but the diode's I-V characteristics allow for high voltages when large ESD currents flow, and these high voltages can still damage core transistors. Some ESD-protection structures use two diodes in series rather than one diode, but such stacked diodes are undesirable in some environments due to the increased voltage drop of two diodes in series.

Silicon-Controlled Rectifiers (SCR's) have also been used successfully. Both an SCR and a diode may be used. However, simply having a diode and an SCR in an ESD-protection structure may produce erratic results that depend on the relative locations of the SCR and diode and other structures such as guard rings.

FIG. 2 shows a safe design window for an ESD protection device. I-V curve 94 shows the current flowing through a prior-art ESD structure as a function of the ESD pulse voltage.

Initially, at the start of an ESD event, the device is off. I-V curve 94 shows that the voltage rises from zero as a diode or other device turns on and conducts current until trigger voltage $V_{TRIG}$. Above this trigger voltage, other devices in the ESD structure turn on, such as a MOS transistor or an SCR, allowing a larger current to flow. Just after trigger voltage $V_{TRIG}$, as the current increases, the diode or SCR shunts the most current, and an avalanche current or similar mechanism may decrease the voltage, causing the snap-back of I-V curve 94. The lowest voltage during snap back is holding voltage $V_{HOLD}$.

The holding voltage $V_{HOLD}$ should be greater than the power-supply voltage VDD to ensure that latch-up does not occur. Also, the maximum voltage, such as trigger voltage $V_{TRIG}$, should be less than the device breakdown voltage $V_{BD}$ to ensure that permanent damage does not occur. Thermal failure can occur when breakdown voltage $V_{BD}$ is exceeded for too long of a period of time. IC reliability is enhanced when the ESD protection structure operates within the safe design window, so that I-V curve 94 operates between VDD and $V_{BD}$.

Actual device curves may vary and show secondary effects not shown in simplified I-V curve 94. As IC processing technology improves and shrinks, $V_{BD}$ decreases due to thinner gate oxides and smaller device sizes in general. Also, VDD may be reduced. Thus the safe design window may shift and shrink. For a 5-volt power supply, the typical safe design window ranges from holding voltage $V_{HOLD}$=5.5 volts to trigger voltage $V_{TRIG}$=9 volts.

FIG. 3 shows a prior-art ESD-protection device using an N-well. A highly-doped P+ anode region 20 acts as the anode (A) and is formed in N-well 62. Isolation 34 can be created by growing field oxide or by other methods to isolate P+ anode region 20 from p-substrate 64 to prevent shorting of the ESD-protection device.

N+ cathode region 40 and P+ tap region 44 are formed on the surface of p-substrate 64. Both N+ cathode region 40 and P+ tap region 44 are connected to the cathode terminal. P+ tap region 44 biases p-substrate 64 with the cathode voltage, such as ground during normal operation.

A PNPN structure is formed that can act as an Silicon-Controlled Rectifier (SCR) during an ESD event. Once the SCR turns on, a large current can flow to shunt the ESD current. N-well 62 acts as the PNP base. The relatively low doping of N-well 62 can produce a low holding voltage, which can violate the safe design window. The relatively large size of N-well 62 produces a large boundary between N-well 62 and N-well 62. This large boundary can have a large capacitance, since capacitance is a function of the junction area. Such a large capacitance is undesirable since it slows down normal signaling.

Some applications such as Universal-Serial-Bus (USB) 3.0 specify a high transfer speed and are sensitive to capacitance on the ESD-protection devices. A Transient Voltage Suppressor (TVS) for ESD protection manufactured with a standard complementary metal-oxide-semiconductor (CMOS) process may have too much capacitance when large wells are incorporated into the TVS device.

What is desired is a Transient Voltage Suppressor (TVS) with a high holding voltage and low capacitance. An ESD-protection device with low capacitance that can be used for high-speed applications is desired. An SCR device constructed from diffusion diodes is desired for thermal stability and robustness.

DETAILED DESCRIPTION

The present invention relates to an improvement in ESD-protection devices. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have recognized that the N-well in the SCR structure is relatively large in area and this large area increases capacitance. Removing the large N-well has the potential to significantly reduce capacitance.

Figure 4:
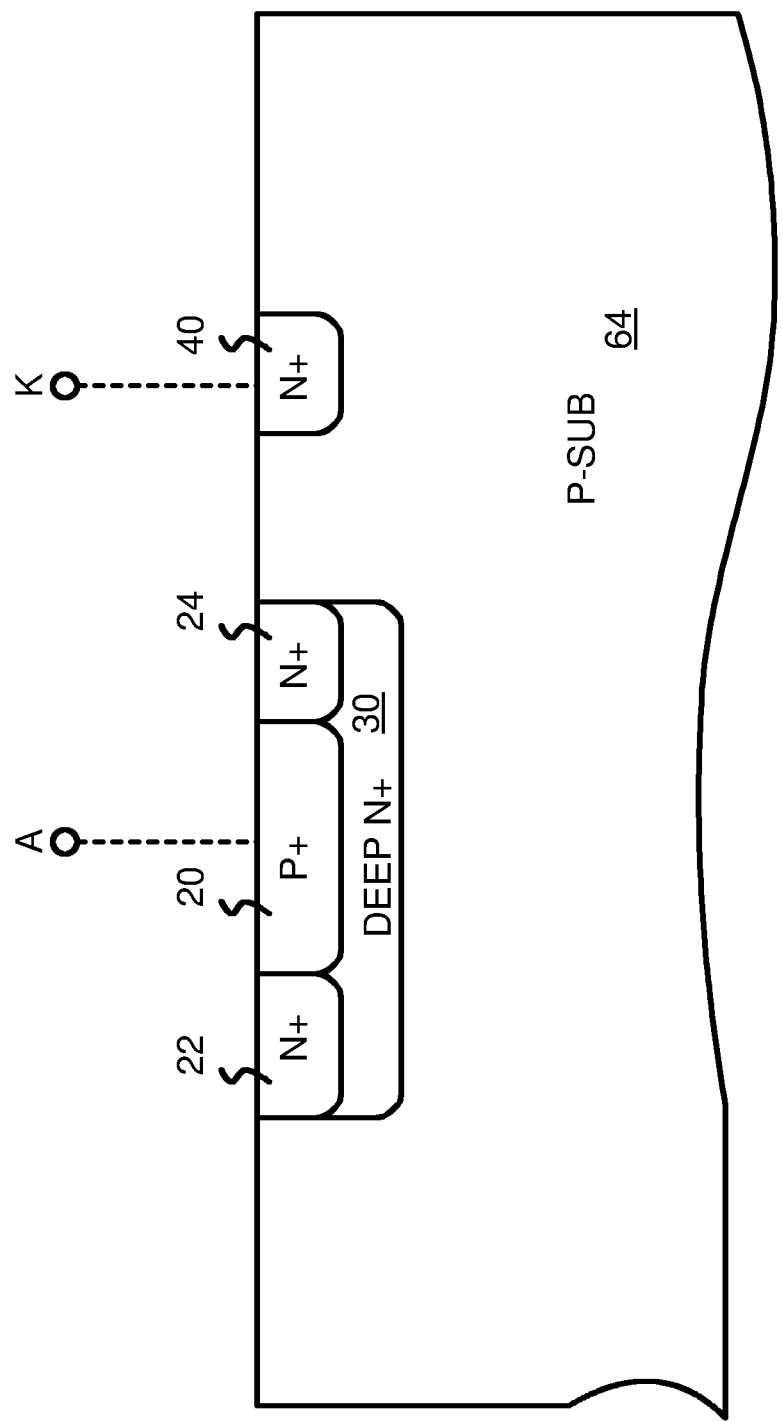
FIG. 4 is a cross-sectional diagram of Transient Voltage Suppressor (TVS) SCR without an N-well.

FIG. 4 is a cross-sectional diagram of Transient Voltage Suppressor (TVS) SCR without an N-well. N+ cathode region 40 is formed in p-substrate 64 and is connected to the cathode terminal. A guard ring or tap can ground p-substrate 64.

Figure 3:
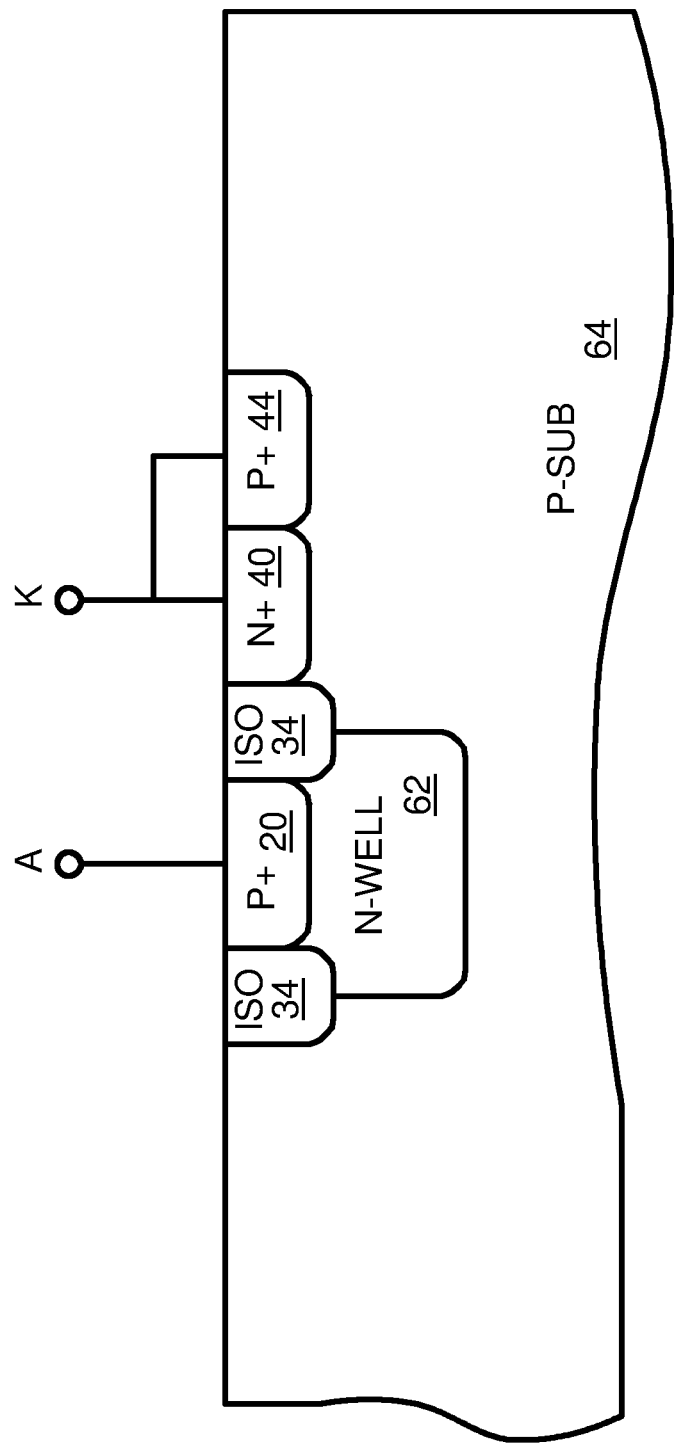
FIG. 3 shows a prior-art ESD-protection device using an N-well.

A highly-doped high-energy implant or deep diffusion is used to create deep N+ region 30 directly in p-substrate 64. High implant energy can be used to implant the N+ dopant to a depth that is just underneath P+ anode region 20. There is no underlying N-well 62 (FIG. 3).

The doping concentration of deep N+ region 30 is much higher than that of N-well 62. For example, deep N+ region 30 can have a doping of $1 \times 10^{19}/cm^3$, compared to a doping of $1 \times 10^{16}/cm^3$ for N-well 62, or a doping of $7 \times 10^{13}$ for p-substrate 64. Thus deep N+ region 30 can have a doping concentration about 1,000 times more than N-well 62, and about 700,000 times more than p-substrate 64. Thus deep N+ region 30 is not simply a highly doped well. Deep N+ region 30 can be formed without any long-time thermal anneal while N-well 62 would require a long-time thermal anneal.

P+ anode region 20 and N+ cathode region 40 have a high doping concentration of $1 \times 10^{19}$ to $6 \times 10^{20}/cm^3$. P+ anode region 20 is formed above deep N+ region 30 and is surrounded by N+ isolation regions 22, 24 that are also formed above deep N+ region 30 and around the perimeter of deep N+ region 30.

The depth of deep N+ region 30 is much less than the depth of N-well 62. Deep N+ region 30 can be only twice the depth of P+ anode region 20, so that the effective thickness of deep N+ region 39 underneath P+ anode region 20 is only 0.2 to 0.3 µm. Deep N+ region 30 can be formed with a high ion implantation energy.

A PNPN SCR structure is formed by P+ anode region 20, deep N+ region 30, p-substrate 64, and N+ cathode region 40. Since the base is deep N+ region 30 rather than a lightly-doped N-well, and deep N+ region 30 has a high hole recombination current, a high holding voltage is obtained. Latch-up is less likely with the high hole recombination rate of deep N+ region 30 compared to the lightly-doped N-well 62. Also, since deep N+ region 30 has a smaller profile, the junction area is reduced compared with the deeper N-well. The decreased junction area provides for lower capacitance, and higher signaling speeds.

Figure 5:
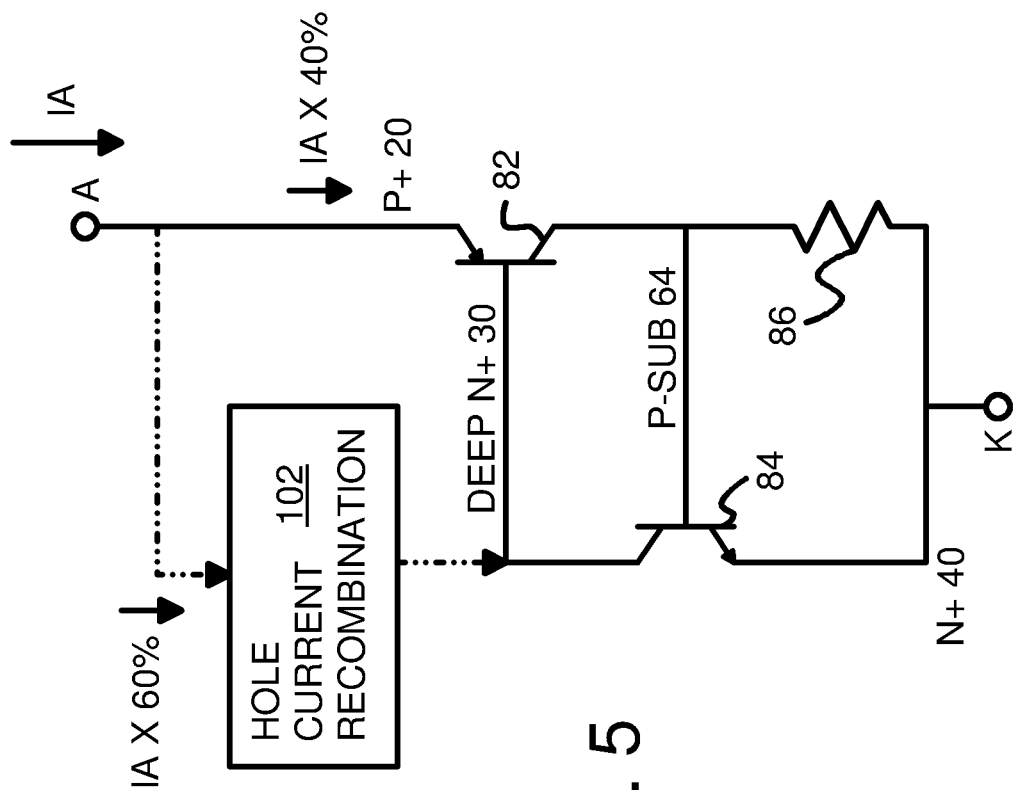
FIG. 5 is a schematic diagram of the TVS SCR without an N-well as shown in FIG. 4.

FIG. 5 is a schematic diagram of the TVS SCR without an N-well as shown in FIG. 4. Current from an ESD even flows from anode A to cathode K from P+ anode region 20, which acts as the emitter of PNP transistor 82, to deep N+ region 30, which acts as the base, to p-substrate 64, which acts as the collector of PNP transistor 82, through p-substrate resistor 86, to N+ cathode region 40. A large current thorough p-substrate resistor 86 creates a voltage drop to the base of NPN transistor 84, turning it on to conduct more current in the SCR. NPN transistor 84 has N+ cathode region 40 as its emitter, p-substrate 64 as its base, and deep N+ region 30 as its collector.

Having a high doping for deep N+ region 30 has an unexpected benefit. The higher N+ doping concentration causes more hold recombination than would occur for a lower doped N-well 62. The greater doping concentration provides more sites in the crystal lattice for carrier recombination to occur, since the dopant atoms strain the crystal lattice. The higher density of recombination sites in the lattice causes a higher hole-recombination current that is diverted and removed from other parts of the TVS device structure.

As the anode current IA from P+ anode region 20 is injected into deep N+ region 30, some of the carriers (holes) cross a recombination side in deep N+ region 30 and are recombined with electrons and removed from the current. Hole current recombination 102 removes a percentage of the anode current IA, so that the current through the base of conducting region 82 to the collector, p-substrate 64, is reduced. Hole current recombination 102 provides a negative feedback to the SCR structure to reduce its current flow.

The recombination rate is the percentage of anode current IA that is recombined in deep N+ region 30. A low-doped N-well 62 would have a recombination rate of about 5%, but deep N+ region 30 has a recombination rate of about 60%, so that only 40% of IA flows through conducting region PNP transistor 82 to p-substrate 64. This surprisingly large recombination rate and the reduced current can reduce current through p-substrate resistor 86. The anode current can be high enough to maintain both PNP transistor 82 and NPN transistor 84 in conducting states.

Figure 6:
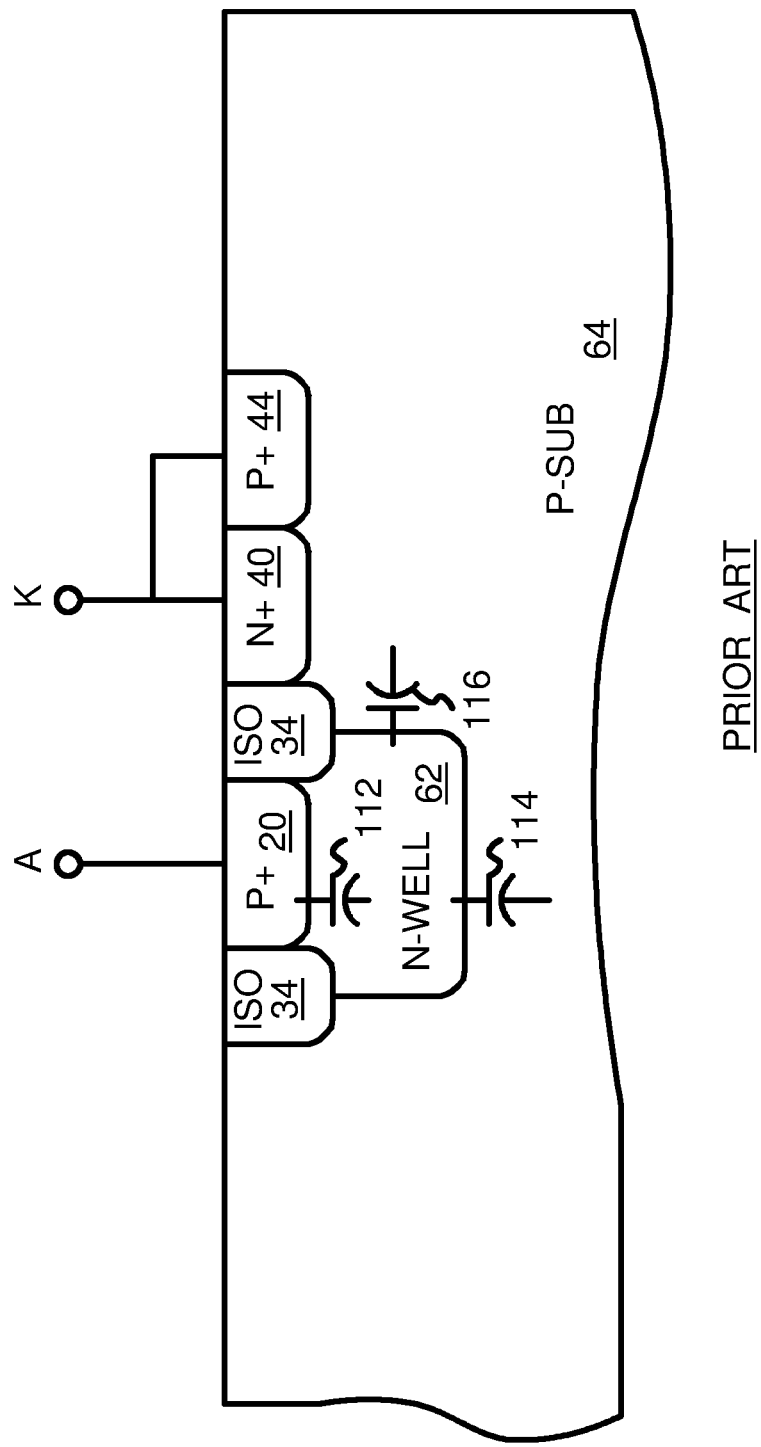
FIG. 6 highlights the cause of the large parasitic capacitance in the prior-art N-Well device.

FIG. 6 highlights the cause of the large parasitic capacitance in the prior-art N-Well device. N-well 62 is relatively deep, so that the sidewall boundary between N-well 62 and p-substrate 64 is relatively large. This large sidewall junction area creates a relatively large capacitance for sidewall capacitor 116 between N-well 62 and p-substrate 64. This large capacitance 116 may slow the circuit for high-speed applications.

The bottom of N-well 62 forms capacitor 114 to p-substrate 64, while the top of N-well 62 forms a capacitor to P+ anode region 20. Capacitors 114, 116 are in parallel with each other an in series with capacitor 112. This parallel connection of capacitors 11, 116 increases the overall capacitance of the network.

Figure 7:
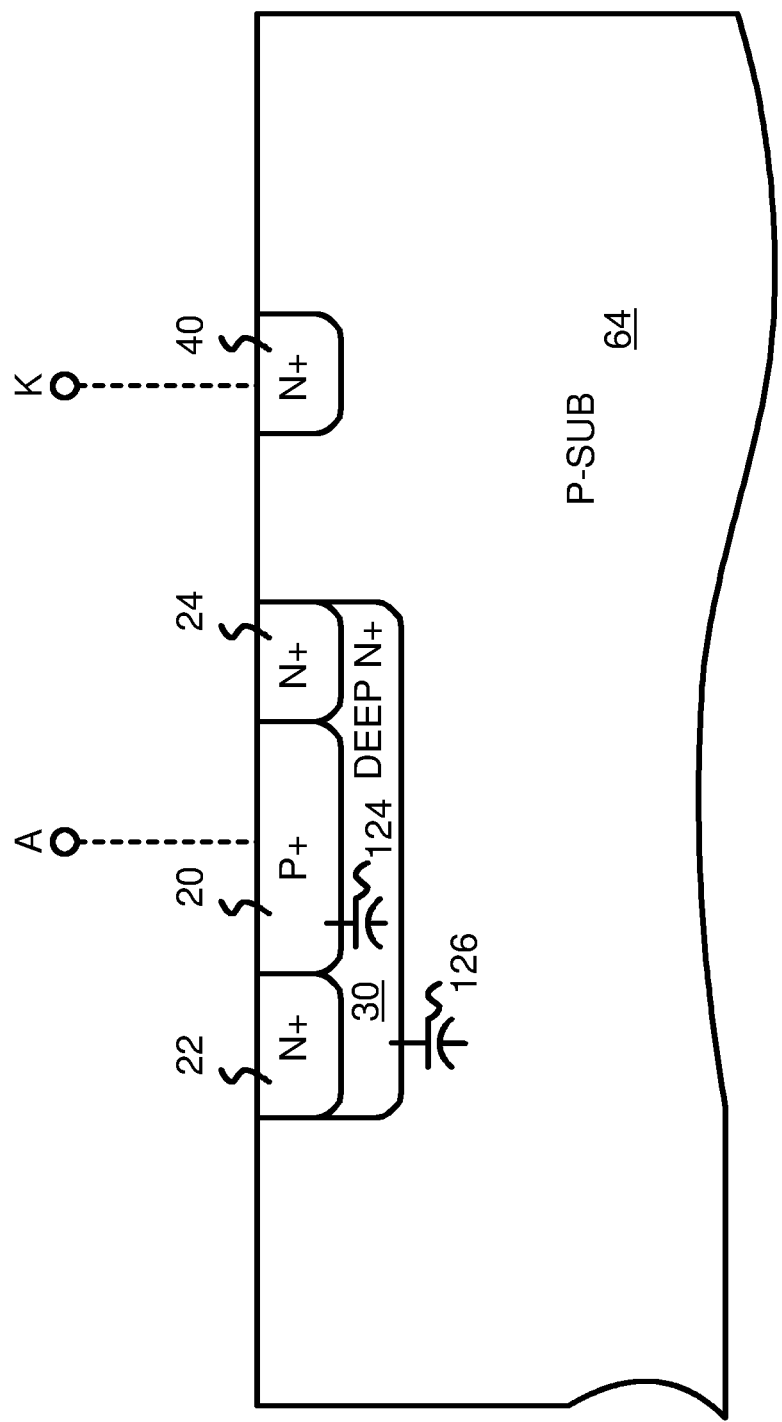
FIG. 7 highlights the lower parasitic capacitance of the in the device without the N-well.

FIG. 7 highlights the lower parasitic capacitance of the in the device without the N-well. deep N+ region 30 is relatively shallow, so that the sidewall boundary between deep N+ region 30 and p-substrate 64 is relatively small and may be negligible.

The bottom of deep N+ region 30 forms capacitor 126 to p-substrate 64, while the top of deep N+ region 30 forms capacitor 124 to P+ anode region 20. Capacitors 124, 126 are in series with each other. This series connection of capacitors 124, 126 reduces the overall capacitance of the network. The lack of any significant sidewall capacitance provides for a lower overall capacitance, allowing for higher-speed applications during normal system operation.

Simulations show that parasitic capacitance is reduced from about 230 fF in the N-well device to only 120 fF using deep N+ region 30. Thus capacitance is reduced by almost half. This halving of capacitance is especially useful for high-speed applications such as with 5 Gbit/s data transfer lines.

The risk of latch-up is lower with the device, as a holding voltage of 5.8 volts can be achieved using deep N+ region 30, while the traditional device using N-well 62 has a much lower holding voltage of 1.7 volts. The trigger voltage is also improved, since the deep N+ region device triggers at 8 volts, while the N-well device triggers at 18.6 volts, according to simulations.

Figure 8:
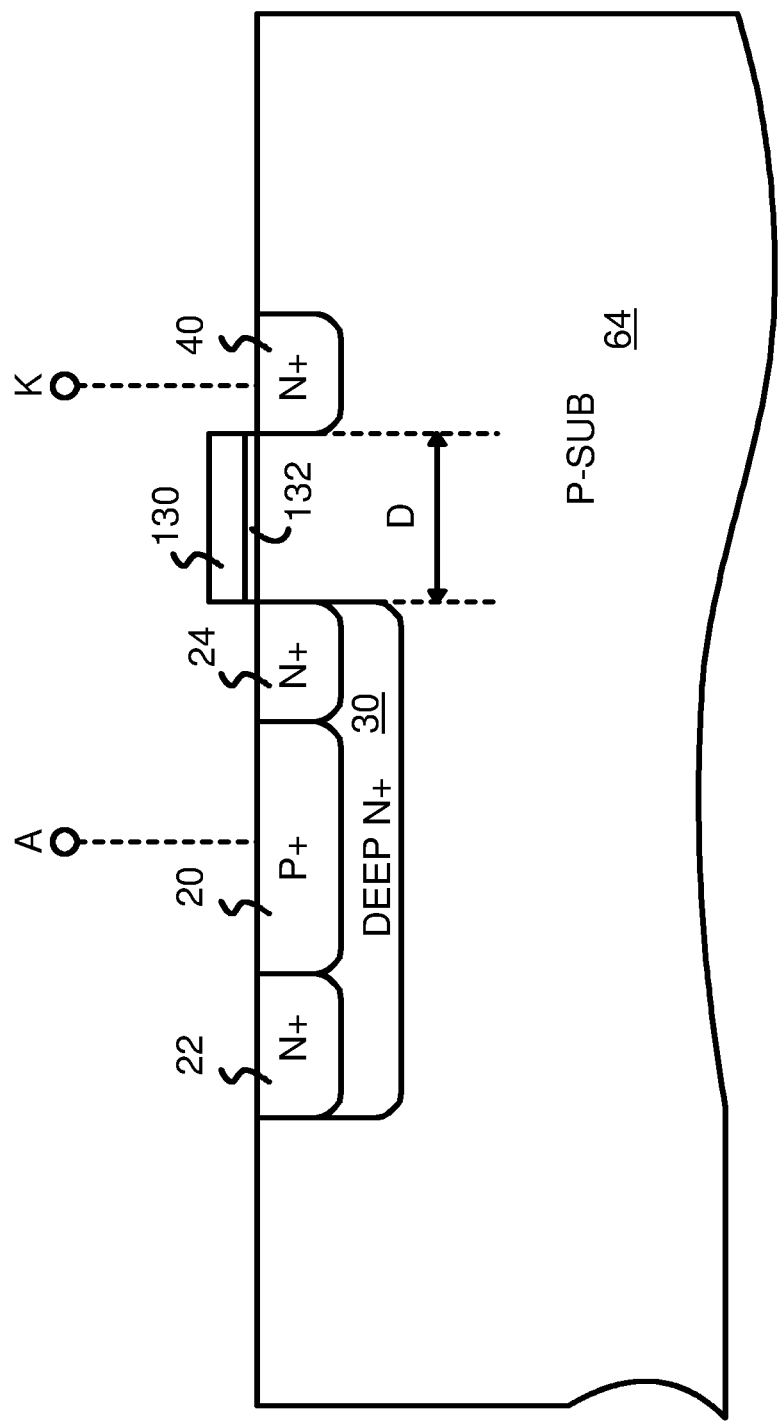
FIG. 8 is an alternative well-less TVS SCR with an added poly gate.

FIG. 8 is an alternative well-less TVS SCR with an added poly gate. In this variation, polysilicon gate 130 is formed over gate oxide 132 between N+ isolation region 24 and N+ cathode region 40. Poly gate 130 is floating and can be non-functional, but is used to set the gate length D, which is the distance between N+ isolation region 24 and N+ cathode region 40. The trigger voltage can be tunable by adjusting the gate length D.

Figure 9:
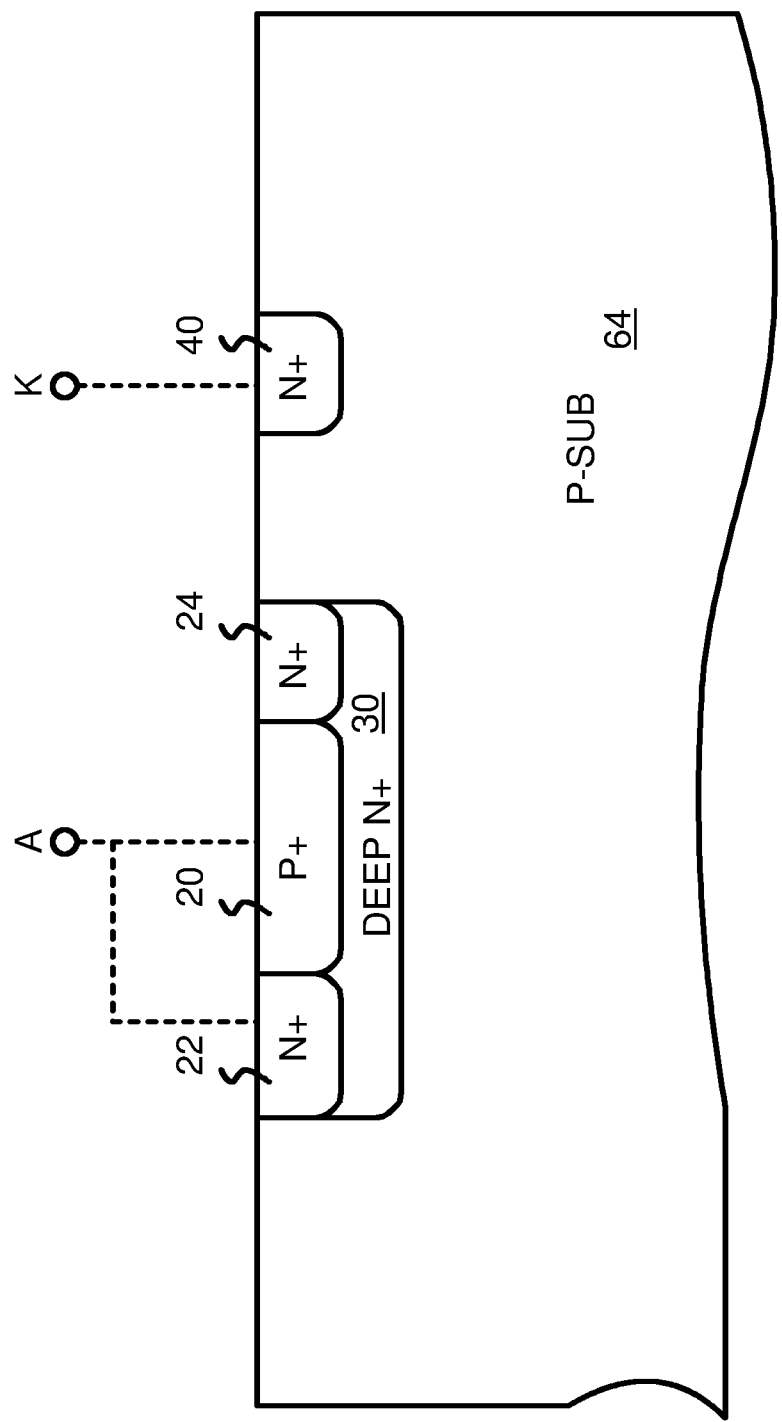
FIG. 9 is an alternative well-less TVS SCR with an added resistor to increase the holding voltage.

FIG. 9 is an alternative well-less TVS SCR with an added resistor to increase the holding voltage. In this alternative, N+ isolation region 22 farthest from N+ cathode region 40 is connected to anode A, while N+ isolation region 24 closest to N+ cathode region 40 remains floating.

Figure 10:
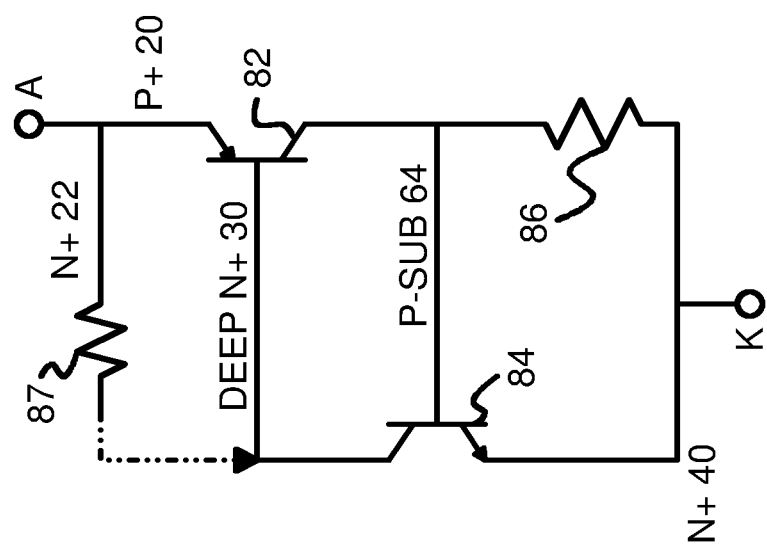
FIG. 10 is a schematic of the alternative well-less TVS SCR with the added resistor to increase the holding voltage shown in FIG. 9.

FIG. 10 is a schematic of the alternative well-less TVS SCR with the added resistor to increase the holding voltage shown in FIG. 9. Connecting N+ isolation region 22 directly to anode A provides a direct current path from anode A to deep N+ region 30, which is the base of PNP transistor 82. This new current path is shown as resistor 87. With the additional current path through resistor 87, the high holding mechanism becomes much more stable, and is robust for some process variations like for N+ isolation 22 dopant and the contact position on P+ region 20.

Figure 11:
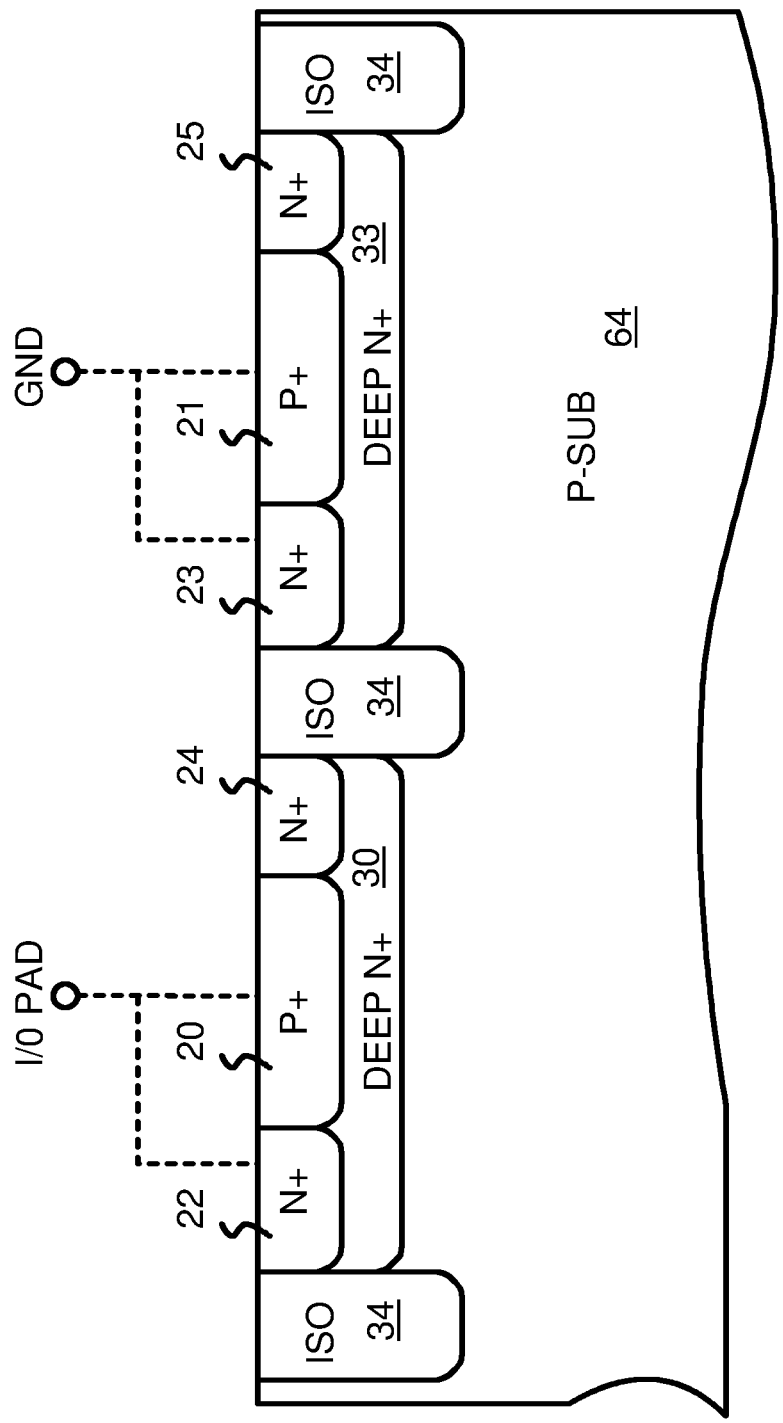
FIG. 11 is an alternative dual bi-directional well-less TVS SCR.

FIG. 11 is an alternative dual bi-directional well-less TVS SCR. The anode-to-deep N+ region structure is duplicated. P+ anode region 20 is formed over deep N+ region 30 and is surrounded by N+ isolation regions 22, 24. Another structure is P+ anode region 21 is formed over deep N+ region 33 and is surrounded by N+ isolation regions 23, 25. Isolation 34 separates these structures so that deep N+ region 30 and deep N+ region 33 are only connected through p-substrate 64.

The I/O pad can connect to P+ anode region 20 while the ground can connect to P+ anode region 21. The I/O pad can optionally also connect to N+ isolation region 22 and ground can optionally connect to N+ isolation region 23 to enhance the current discharge.

Figure 12:
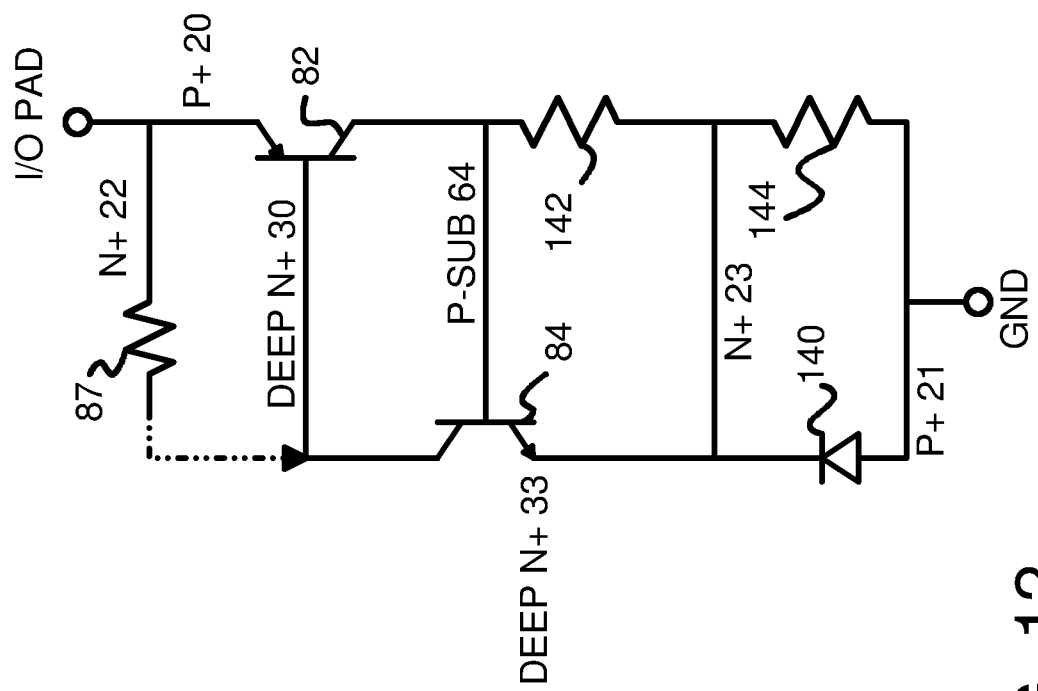
FIG. 12 is a schematic of the dual bi-directional well-less TVS SCR shown in FIG. 11.

FIG. 12 is a schematic of the dual bi-directional well-less TVS SCR shown in FIG. 11. The left structure connected to the I/O pad has deep N+ region 30 as the base of PNP transistor 82, with p-substrate 64 being the base of NPN transistor 84. P-substrate resistor 142 carries current between the 2 structures.

Deep N+ region 30 of the second structure is the collector of NPN transistor 84, which connects to parasitic pn diode 140 from deep N+ region 33 and N+ isolation region 23 to P+ anode region 21. When N+ isolation region 23 optionally connects to ground, resistor 144 can directly carry current from N+ isolation region 23 to ground, bypassing P+ anode region 21.

Figure 13:
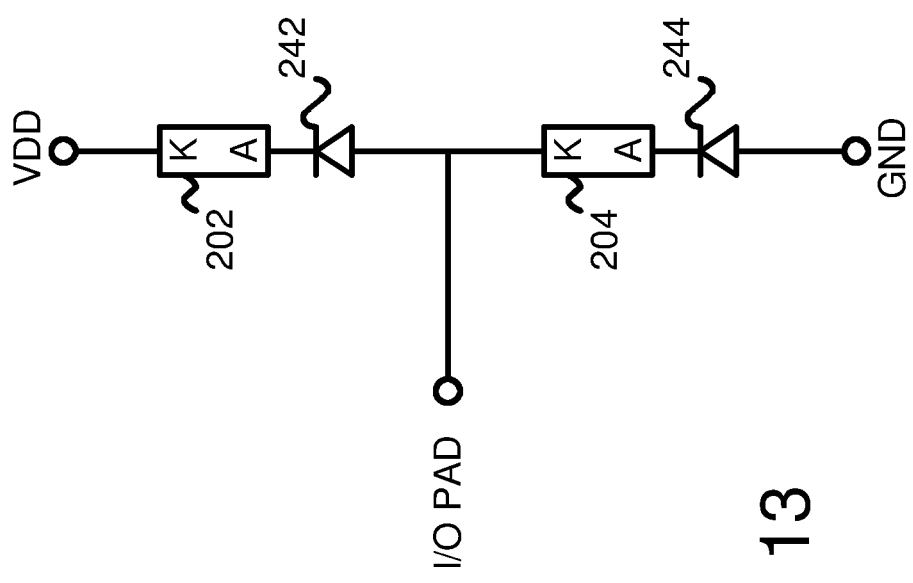
FIG. 13 is a schematic of the well-less TVS SCR duplicated and combined with passive components.

FIG. 13 is a schematic of the well-less TVS SCR duplicated and combined with passive components. The TVS SCR device of FIG. 4, 8, 9, or 11 is shown as TVS SCR 202 and is duplicated as TVS SCR 204. Diode 242 connects to the anode of TVS SCR 202 while the cathode of TVS SCR 202 is connected to power-supply VDD. Diode 244 is connected between ground and the anode of TVS SCR 204 while the cathode of TVS SCR 204 is connected to the I/O pad and to diode 242. ESD protection is provided to the I/O pad for both high and low going ESD pulses.

Figure 14:
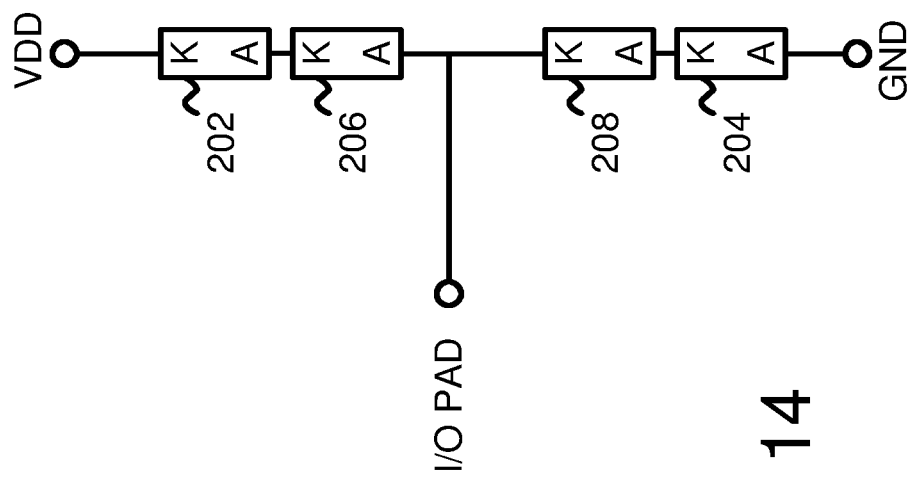
FIG. 14 is a schematic of the well-less TVS SCR duplicated in series.

FIG. 14 is a schematic of the well-less TVS SCR duplicated in series. The TVS SCR device of FIG. 4, 8, 9, or 11 is shown as TVS SCR 202, 204, 206, 208. TVS SCR 202 and TVS SCR 206 are placed in series between VDD and the I/O pad, while TVS SCR 204 and TVS SCR 208 are placed in series between the I/O pad and ground. Having two or more TVS SCR 202 in series reduces the voltage drop across a single TVS SCR 202, reducing potential damage and allowing for a better design window.

Alternate Embodiments

Several other embodiments are contemplated by the inventors. For example, P-substrate 64 can have a low doping such as $1\times10^{13}$ to $1\times10^{15}$/cm$^3$, which can produce a substrate resistance of 50 Ohm/cm or more for p-substrate 64.

The alternatives of FIGS. 8-14 may be combined in various ways, or may be used separately or in other combinations. Diodes 242, 244 could be replaced with other passive components, such as a resistor, capacitor, inductor, or various networks of such passive devices, and could be placed in series or in parallel with TVS SCR 202, 204. More than two TVS SCR 202 could be placed in series.

While electrical properties vary with process, design, and layout variations, the well-less TVS SCR is able to discharge a transient current of 10-40 amps. The large holding voltage prevents latch-up. The low capacitance by removing the N-well improves the potential data transmission speed. A standard CMOS process with an extra step for deep N+ region 30 can be used, providing durability comparable to a standard CMOS process.

While descriptions of current flows and operations have been presented, these are theoretical and the theories may be incomplete or even incorrect. Regardless of the physical mechanisms and theoretical interpretations, the structure does offer protection from ESD pulses. Especially for small devices, currents may flow in unusual ways and using mechanisms that have not yet been thoroughly researched and understood.

Cutouts in diffusion and other regions may be used. Other shapes and physical layouts may be substituted, such as intermingled fingers or doughnuts or offsets. A P+ tap for p-substrate 64 could be added or p-substrate 64 could be left floating during ESD events.

A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. The power node could be a common-discharge line (CDL) that normally floats rather than a power line. While a simple inverter of core transistors 322, 324 has been shown, more complex gates and interconnections may drive internal nodes, and there can be several internal nodes that connect to different input or output pads. The input/output pads may be connected to an input buffer, test-scan logic, and other circuits. More than one power supply may be used.

P and N wells could be reversed, and a NPNP lateral SCR used rather than a PNPN SCR. Some embodiments may use an additional N+ or P+ implant region, or the location and depth of implant regions may be shifted. The final profiles and shapes of various layers may differ depending on the process used. In particular, deeper layers may shift around relative to the mask layouts. Also, the mask edges and final processed boundaries may differ with process steps. N+ isolation regions 22, 24 may straddle the edge of deep N+ region 30.

The shape of the SCR device may differ, such as by having a more rounded bottom or field-oxide boundaries. Guard rings may be continuous, or have openings or cutouts for various reasons. P+ guard rings and N+ guard rings may be electrically connected together and left floating, or connected to a fixed voltage such as the power supply or ground, or may be connected to different voltages.

Additional leaker devices such as resistors and small transistors could be added. Parasitic capacitances and resistances may be used from some components, depending on the process and device sizes used.

The ESD-protection circuit can be combined with other input-protection circuits, such as a power clamp circuit, other pad protection circuits, or a series-resistor protection circuit to the gate of an input buffer. Grounded-gate and thick oxide protection transistors and diodes can also be added at various points to increase ESD protection. One, two, of four of the well-less SCR structures could be added to each I/O pin, or just to input pins.

Figure 1:
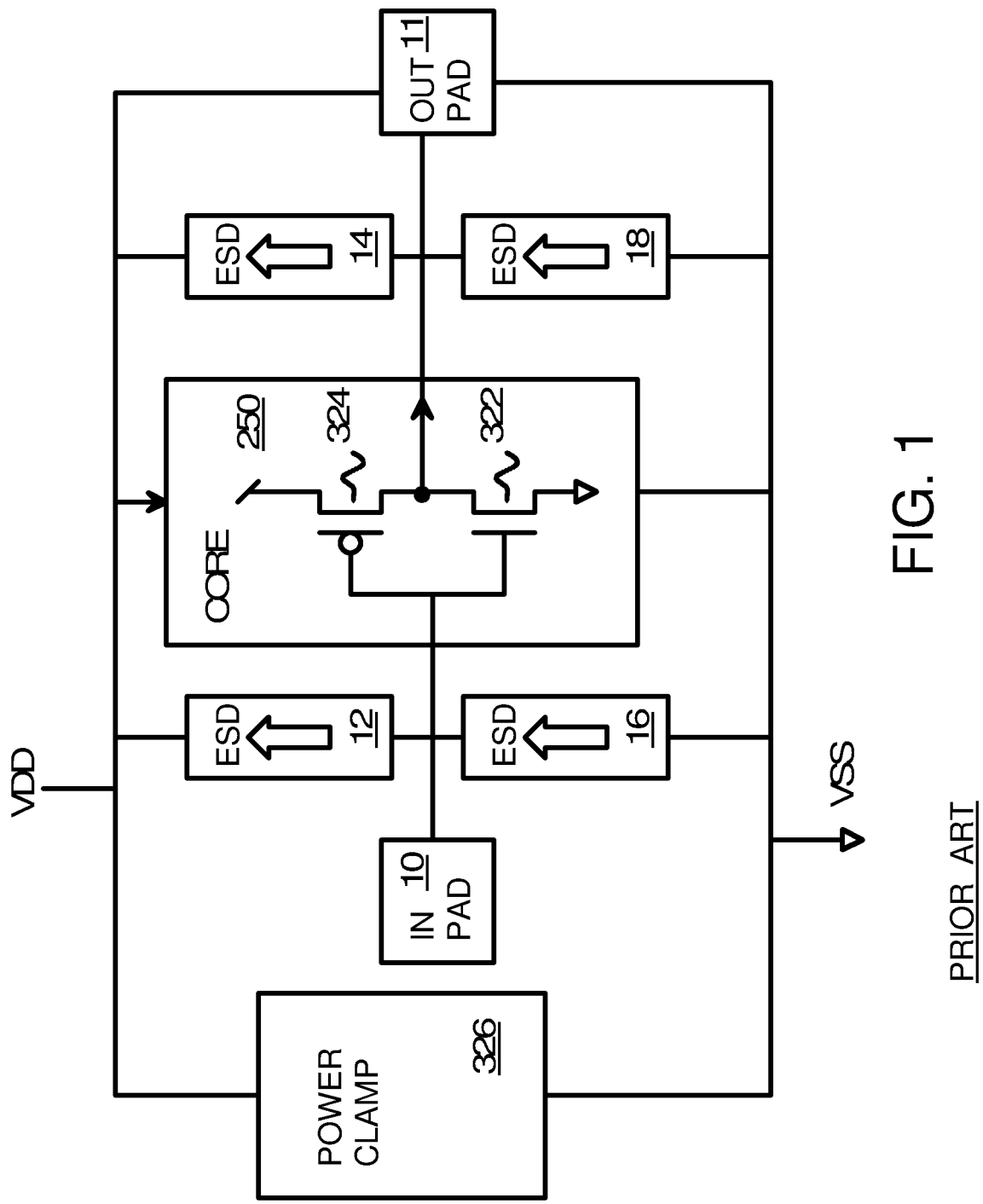
FIG. 1 shows a chip with several ESD-protection clamps.
Figure 2:
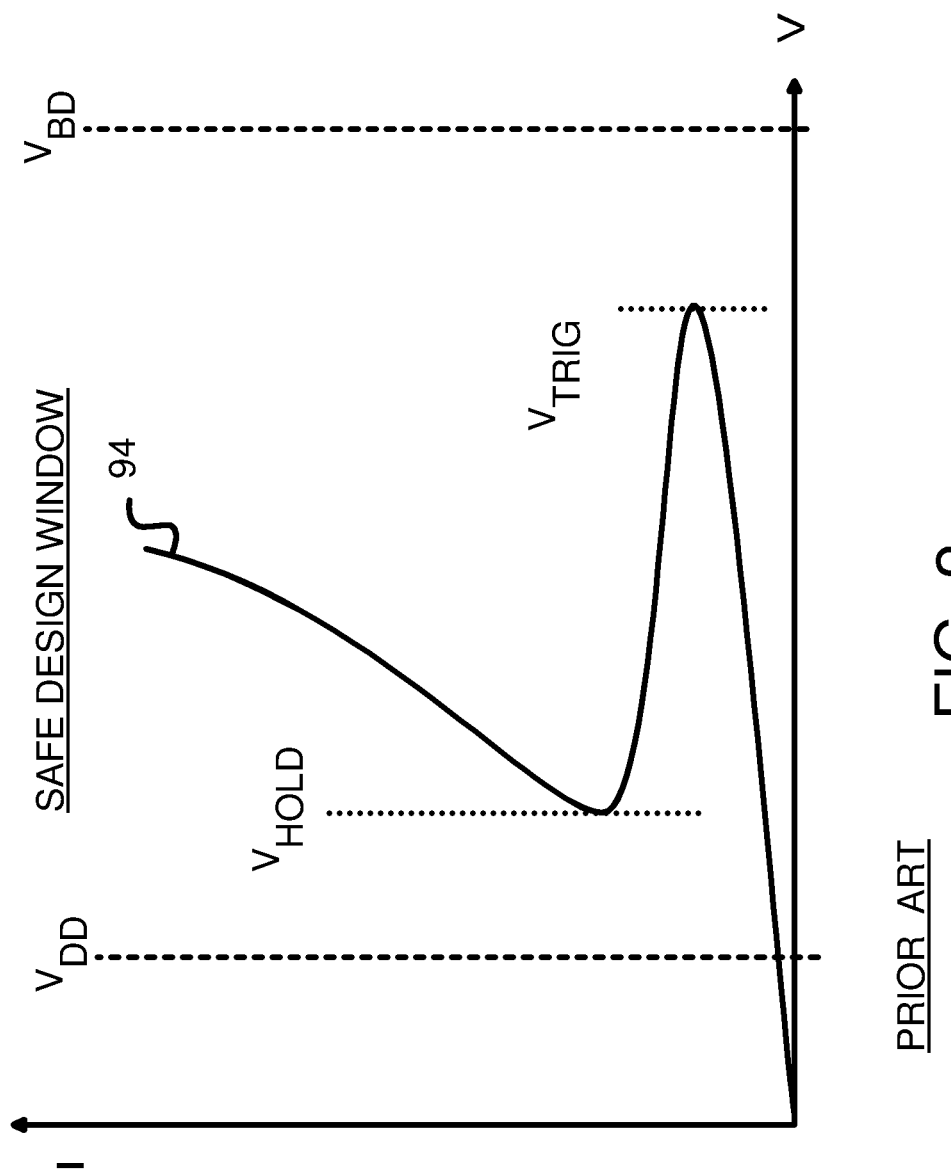
FIG. 2 shows a safe design window for an ESD protection device.

Both thick oxide and thin oxide transistors may be protected by a power clamp and ESD protection devices. Alternately, several power clamps with different combinations of transistors and power-supply voltages may be used. Each pad may have only one ESD protection device, only two ESD protection devices, or four ESD protection devices as shown in FIG. 1. The anode and cathode (A and K) nodes may be reversed to swap the direction of protection.

Bias, VDD, and voltage values may vary somewhat due to process, temperature, and design variances.

The trigger and holding voltages may vary with process, temperature, and exact geometries of the transistors. While descriptions of operation have been given based on a theoretical understanding of the physical processes, these theoretical descriptions may be incorrect. Second and third order effects may also be present. Various mechanisms may be responsible for breakdown and conduction under various conditions.

Large output driver transistors also act as large diodes for some ESD tests and conditions. For example, when the ESD pulse is applied across an I/O pad and the power-supply pad, a positive ESD pulse can turn on a parasitic p-n drain-substrate junction of the drain of the large p-channel driver transistor. The n-type substrate or well of the p-channel driver transistor is normally connected to the I/O power supply. Thus the p-n junction is forward biased by the positive ESD pulse. While output pads have been described, other connection technologies may be substituted, such as ball-grid-array (BGA), flip-chip, etc., and the term pads is considered to apply to all such balls, pads, landings, etc. that are for external connection.

Likewise, when the ESD pulse is applied across the I/O pad and the ground pad, a negative ESD pulse can turn on the parasitic n-p drain-substrate junction of the drain of the large n-channel driver transistor. The p-type substrate or well of the n-channel driver transistor is normally connected to the I/O ground. Thus the p-n junction is forward biased by the negative ESD pulse. Various cross-domain coupling paths and mechanisms may exist that couple ESD pulses applied to one power-supply domain to another power-supply domain.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A well-less Transient Voltage Suppressor (TVS) Silicon-Controlled Rectifier (SCR) device comprising:
   a p-substrate;
   a deep N+ region formed in the p-substrate;
   a P+ anode region formed over the deep N+ region in the p-substrate;
   an N+ isolation region surrounding the P+ anode region and formed over the deep N+ region in the p-substrate; and
   an N+ cathode region formed in the p-substrate;
   wherein the deep N+ region is in direct contact with the P+ anode region, the N+ isolation region, and the p-substrate; and
   wherein the deep N+ region has a doping concentration that is at least 10,000 times greater than a doping concentration of the p-substrate.

2. The well-less TVS SCR device of claim 1 wherein at least half of an anode current applied to an anode terminal that is connected to the P+ anode region is recombined in the deep N+ region and does not flow to the p-substrate,
   whereby recombination in the deep N+ region consumes more than half of the anode current.

3. The well-less TVS SCR device of claim 1 wherein the P+ anode region is not connected to any N-well having a doping concentration that is less than 10,000 times greater than a doping concentration of the p-substrate.

4. The well-less TVS SCR device of claim 3 wherein the P+ anode region and the N+ isolation region each have a doping concentration that is at least equal to the doping concentration of the deep N+ region.

5. The well-less TVS SCR device of claim 4 wherein a depth of the deep N+ region is not more than three times a depth of the P+ anode region.

6. The well-less TVS SCR device of claim 5 wherein the deep N+ region has a doping concentration of $5 \times 10^{18}$ to $5 \times 10^{19}/cm^3$.

7. The well-less TVS SCR device of claim 1 wherein a depth of the deep N+ region is not more than twice a depth of the P+ anode region.

8. The well-less TVS SCR device of claim 1 wherein the deep N+ region has a doping concentration within a factor of 10 of $10^{19}/cm^3$;
   wherein the N+ isolation region comprises a remote N+ isolation region and a close N+ isolation region, wherein the remote N+ isolation region is located a greater distance to the N+ cathode region than the close N+ isolation region;
   an anode terminal having a wired connection to the P+ anode region;
   a second wired connection from the anode terminal to the remote N+ isolation region;
   whereby the second wired connection provides a direct current path from the anode terminal to the deep N+ region in parallel with a pn junction between the P+ anode region and the deep N+ region.

9. The well-less TVS SCR device of claim 1 further comprising:
   a second deep N+ region formed in the p-substrate;
   wherein the second deep N+ region has a doping concentration of $5 \times 10^{18}$ to $5 \times 10^{19}/cm^3$;
   a second P+ anode region formed over the second deep N+ region in the p-substrate;
   a second N+ isolation region surrounding the second P+ anode region and formed over the second deep N+ region in the p-substrate;
   a second terminal connected to the second P+ anode region.

10. The well-less TVS SCR device of claim 9 further comprising:
    an isolation region formed between the N+ isolation region and the second N+ isolation region;
    wherein the P+ anode region is connected to an I/O pad, and the second P+ anode region is connected to a ground.

11. The well-less TVS SCR device of claim 1 further comprising:
    a diode coupled between the P+ anode region and a ground;
    wherein the N+ cathode region is connected to an I/O pad.

12. A well-less Electro-Static-Discharge (ESD) input-protection device comprising:
    a p-substrate;
    an anode terminal;
    a P+ anode region formed near a surface of the p-substrate and connected to the anode terminal;

a first N+ isolation region formed near the surface of the p-substrate and adjacent to the P+ anode region; and a deep N+ region formed under the P+ anode region and under the first N+ isolation region;

wherein the deep N+ region is in direct contact with the P+ anode region, the first N+ isolation region, and the p-substrate;

wherein the deep N+ region is not in direct contact with any N-well in the p-substrate.

13. The well-less ESD input-protection device of claim 12 wherein the deep N+ region is disposed in the p-substrate at a depth than is no more than twice a depth of the P+ anode region.

14. The well-less ESD input-protection device of claim 13 wherein half or more of an anode current applied to the anode terminal is consumed by recombination with electrons in the deep N+ region.

15. The well-less ESD input-protection device of claim 12 wherein the deep N+ region has a doping concentration that is within a factor of 10 of a doping concentration of the first N+ isolation region;

wherein the deep N+ region has a doping concentration that is at least 10,000 times a doping concentration of the p-substrate.

16. The well-less ESD input-protection device of claim 12 wherein the deep N+ region has a doping concentration of $5 \times 10^{18}$ to $5 \times 10^{19}/cm^3$.

17. The well-less ESD input-protection device of claim 16 further comprising:

a cathode terminal;

an N+ cathode region formed in the p-substrate and connected to the cathode terminal.

18. The well-less ESD input-protection device of claim 17 further comprising:

a second N+ isolation region formed near the surface of the p-substrate and adjacent to the P+ anode region, the N+ cathode region being located farther from the second N+ isolation region than from the first N+ isolation region;

wherein the anode terminal also directly connects to the second N+ isolation region.

19. The well-less ESD input-protection device of claim 18 further comprising:

a poly gate formed between the first N+ isolation region and the N+ cathode region, the poly gate formed directly over the p-substrate where the p-substrate has received no additional surface doping;

wherein a length of the poly gate between the first N+ isolation region and the N+ cathode region determines a trigger voltage of the well-less ESD input-protection device.

20. A Silicon-Controlled Rectifier (SCR) Electro-Static-Discharge (ESD) protection device comprising:

a p-substrate having a doping concentration that is lower than $1 \times 10^{15}/cm^3$;

a first P+ anode region formed in the p-substrate and connected to an I/O pad;

a first remote N+ isolation region formed in the p-substrate adjacent to the first P+ anode region;

a first central N+ isolation region formed in the p-substrate adjacent to the first P+ anode region;

a first deep N+ region formed in the p-substrate underneath the first P+ anode region, the first remote N+ isolation region, and the first central N+ isolation region, the first deep N+ region having a dopant concentration that is at least 10,000 times a doping concentration of the p-substrate and is within a factor of 1,000 of a doping concentration of the first remote N+ isolation region;

a second P+ anode region formed in the p-substrate and connected to an supply pad;

a second remote N+ isolation region formed in the p-substrate adjacent to the second P+ anode region;

a second central N+ isolation region formed in the p-substrate adjacent to the second P+ anode region;

a second deep N+ region formed in the p-substrate underneath the second P+ anode region, the second remote N+ isolation region, and the second central N+ isolation region, the second deep N+ region having a dopant concentration that is at least 10,000 times a doping concentration of the p-substrate and is within a factor of 1,000 of a doping concentration of the second remote N+ isolation region; and an oxide isolation region formed between the first central N+ isolation region and the second central N+ isolation region.

* * * * *